(12) United States Patent
Wiesemann

(10) Patent No.: US 6,456,060 B1
(45) Date of Patent: Sep. 24, 2002

(54) MULTI-METER WITH LOCKING CLAMP

(75) Inventor: David L. Wiesemann, Pewaukee, WI (US)

(73) Assignee: Actuant Corporation, Glendale, WI (US)

( * ) Notice: Subject to any disclaimer, the term of this patent is extended or adjusted under 35 U.S.C. 154(b) by 2 days.

(21) Appl. No.: 09/650,249

(22) Filed: Aug. 29, 2000

(51) Int. Cl.[7] .................... G01R 19/14; G01R 1/04
(52) U.S. Cl. ....................... 324/127; 324/156
(58) Field of Search ................. 324/127, 115, 324/116, 121 R, 72.5, 117, 133, 156

(56) References Cited

U.S. PATENT DOCUMENTS 5,610,512 A * 3/1997 Selcuk ................. 324/127

* cited by examiner

Primary Examiner—N. Le
Assistant Examiner—James Kerveros
(74) Attorney, Agent, or Firm—Quarles & Brady LLP

(57) ABSTRACT

Disclosed herein is a hand-held clamp-type multi-meter capable of measuring current and other electrical characteristics. The clamp includes a hinged jaw which is openable in the current detecting mode of the multi-meter, but not in other modes.

2 Claims, 3 Drawing Sheets

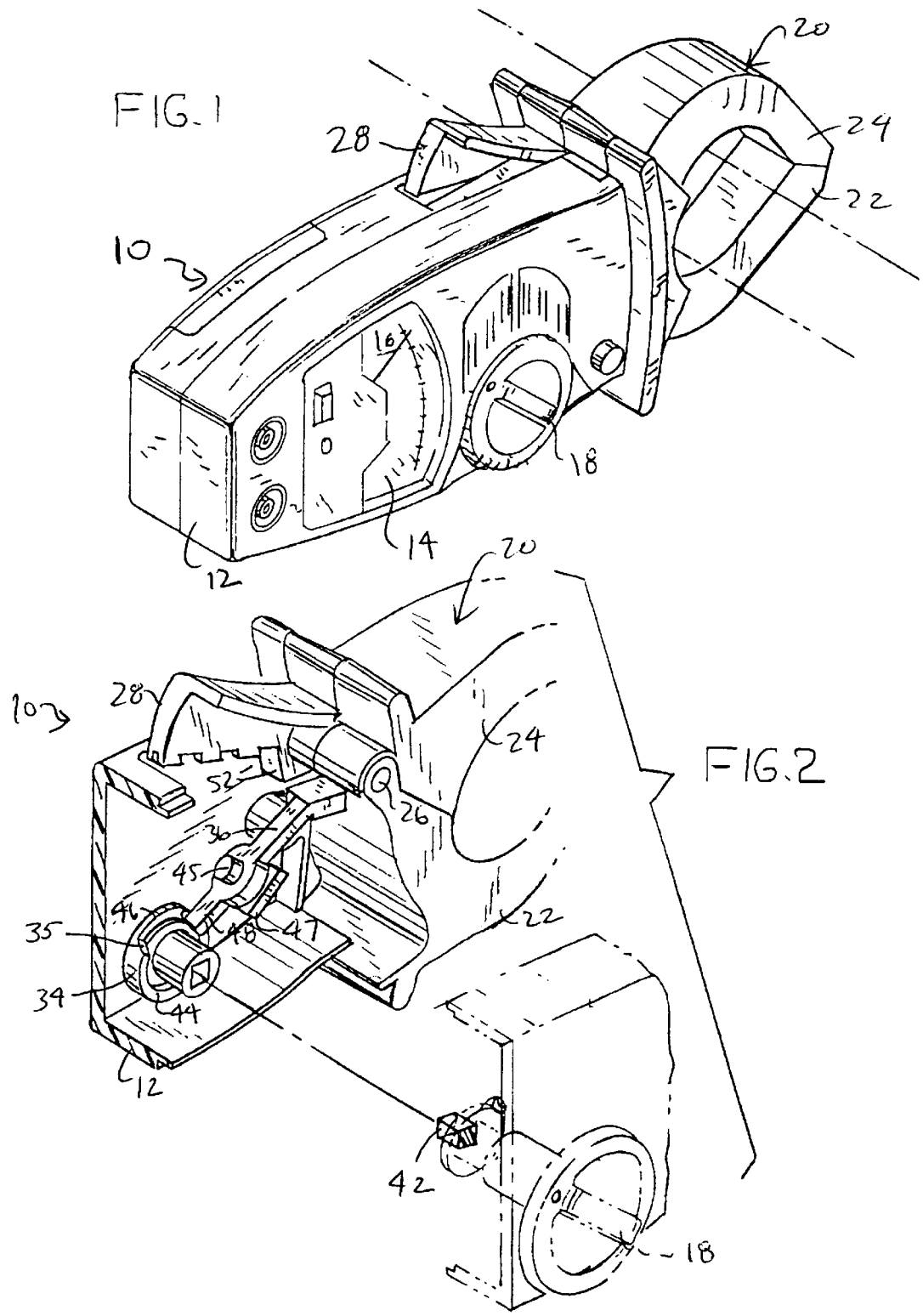

MULTI-METER WITH LOCKING CLAMP

CROSS-REFERENCE TO RELATED APPLICATIONS (Not applicable)

STATEMENT REGARDING FEDERALLY SPONSORED RESEARCH/DEVELOPMENT (Not applicable)

BACKGROUND OF THE INVENTION

The present invention relates to meters for measuring electrical parameters such as current and in particular to multi-meters which include a clamp-type ammeter.

Meters for measuring current, voltage and resistance or to detect electrical continuity of an electrical device or line are well known. Such meters typically include sensing circuitry as known in the art to measure only one or more of these parameters. Multi-meters are capable of measuring multiple parameters and include a selector for switching the sensing circuitry to detect the desired parameter.

Some multi-meters have a conductive wire coil or metallic loop that can be positioned about an electrical line, cable or bus bar to measure the current passing therethrough by picking up the surrounding inductive field. A closed loop is necessary to provide a closed electrical path to the sensing circuitry of the meter. Some meters, known as clamp-type ammeters, have a split loop disposed in a C-shaped clamp that can be opened to fit around the line. When the clamp is closed the loop again defines a closed path.

The coil or conductive loop is connected in the sensing circuitry so as to only measure current. That is, the loop is inoperative for measuring voltage or resistance. The clamp is only meant to be used when the selector is in the current measurement position. Thus, if a user attempts to measure voltage, for example, with the loop, the multi-meter would not provide a measurement. The same is the case if the user intended to measure current with the loop but the selector was positioned in a voltage or resistance measurement mode. In either situation, this may be frustrating for the user and cause him or her to incorrectly believe that the multi-meter was broken or functioning improperly. This can harm the reputation of the manufacturer and result in returned merchandise or exercised warranties despite the fact that the meter operates properly. This process can be time consuming and expensive for both the user and the manufacturer.

Accordingly, a need exists in for an improved clamp-type multi-meter.

SUMMARY OF THE INVENTION

The present invention provides a hand-held clamp-type multi-meter in which the current clamp can be opened only when the meter is set to measure current.

Specifically, the present invention is a multi-meter at least capable of detecting the current and one other electrical characteristic of an electrical line connected to an electrical circuit. The multi-meter has an indicator coupled to sensing circuitry that includes an electrically conductive loop disposed in two jaws of a current clamp. The jaws are opposable so that the current clamp can be separated and fit around the line without disconnecting it from the circuit. The current clamp can be opened only when the multi-meter is set in the current measuring mode.

Thus, the present invention ensures that the conductive loop is used only for measuring current. The multi-meter includes a locking mechanism which prevents the current clamp from opening if the multi-meter is not set to measure current. When the current clamp is open, the locking mechanism also prevents the multi-meter from being set to measure another parameter, such as voltage or resistance.

In a preferred form, the multi-meter includes a palm-sized housing in part containing the sensing circuitry and to which is mounted a measurement selector for switching the sensing circuitry between voltage, current and other parameters. Rotation of the measurement selector to measure current operates the locking mechanism to unlock the current clamp. A thumb lever is connected integrally to a pivotable jaw of the current clamp that is biased to close the jaws. When the multi-meter is set to measure current, the locking mechanism is positioned to allow the thumb lever to be depressed inwardly, which rotates the pivotable jaw away from a fixed jaw and separates the loop. Preferably, both jaws are arcuate members defining a closed path with an opening therebetween. The jaws, which include the loop, may also include an electrically inert covering material, such as plastic, which houses the inductive pick-up loop. The mating ends of the fixed and pivotable jaws of the current clamp have openings that allow the loop to define a closed circuit when the current clamp is closed.

A preferred embodiment of the invention is stated in the following description and illustrated in the accompanying drawings which form a part hereof. Such embodiment does not necessarily represent the full scope of the invention, however, and reference must be made therefore to the claims for interpreting the scope of the invention.

BRIEF DESCRIPTION OF THE DRAWINGS

FIG. 1 is a perspective view of the hand-held multi-meter with a current clamp of the present invention clamped around an electrical line (shown in phantom);

FIG. 2 is a partial cut-away view of the multi-meter of FIG. 1 showing the current clamp locking mechanism;

DETAILED DESCRIPTION OF THE PREFERRED EMBODIMENT

Figure 3:
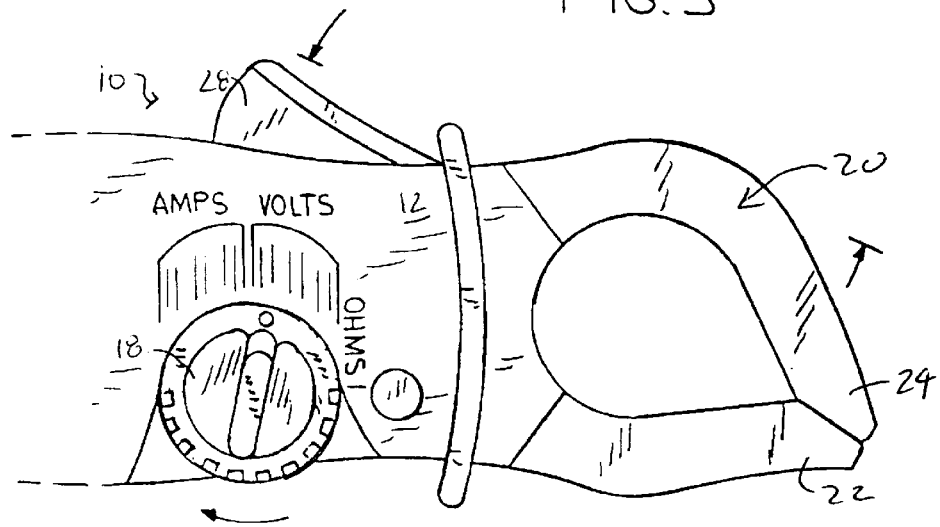
FIG. 3 is a partial front plan view showing a measurement selector positioned to measure voltage and the current clamp locked closed.

Referring to FIG. 1, a multi-meter 10 includes a palm-sized housing 12, preferably made of a suitable rigid plastic containing current, voltage and resistance sensing circuitry (not shown), as known in the art, and a power supply (not shown) such as two AA sized batteries. The housing 12 also includes an analog gauge 14 electrically coupled to the sensing circuitry and viewable through a transparent window 16, from which the value of the electrical characteristic (i.e., current, voltage, or resistance) can be read. All features of the multi-meter 10 except the locking feature of the clamp described below are conventional and therefore not described in detail.

The housing 12 also mounts a rotary measurement selector 18 for switching the sensing circuitry as known in the art to measure current, voltage or resistance in a circuit as well as between various sensitivity levels of amperage and voltage. At one end of the housing 12 is an inductive pick-up current clamp 20 having a fixed jaw 22 and a pivotable jaw 24 rotatable about a pivot pin 26. As is well-known, the jaws 22 and 24 include a conductive loop of laminated steel sheets electrically connected to the sensing circuitry and housed in plastic sheaths. When closed, the laminations of the jaws 22 and 24 form a closed magnetic inductive pick-up loop in well-known fashion.

Figure 4:
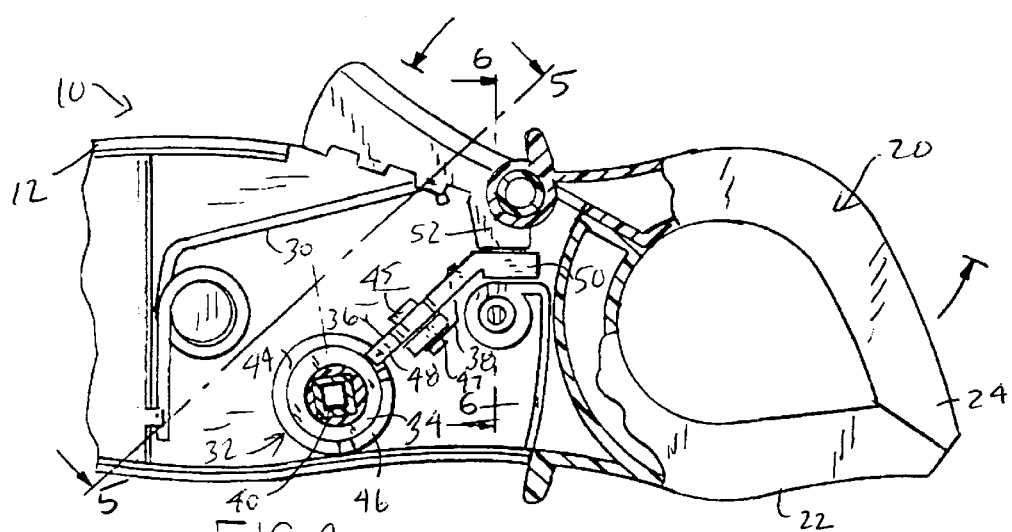
FIG. 4 is cut-away view of FIG. 3 showing the locking mechanism.

Referring to FIG. 2, the jaws 22 and 24 are connected to the housing 12 at pivot pin 26. Pivotable jaw 24 is freely rotatable about the pivot pin 26 while the fixed jaw 22 is stationary. Integrally molded to the plastic sheath of the pivotable jaw 24 is a thumb-operated lever 28 for opening the current clamp 20 by depressing the thumb lever 28 downward. As shown in FIG. 4, the thumb lever 28 is biased outward by a torsion spring 30 fixed to the housing 12, which biases the current clamp 20 closed. The movement of the thumb lever 28 is controlled by a locking mechanism 32 also mounted in the housing 12, the operation of which is controlled by the measurement selector 18.

Figure 5:
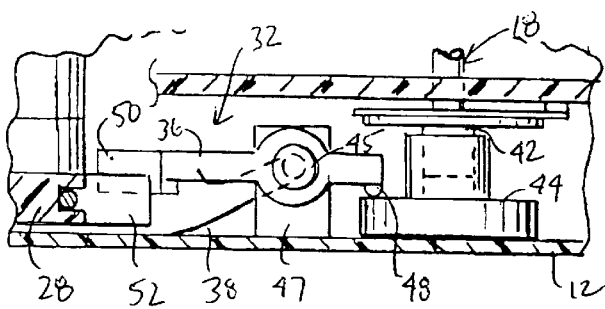
FIG. 5 is a side cross-sectional view taken along line 5—5 of FIG. 4.
Figure 6:
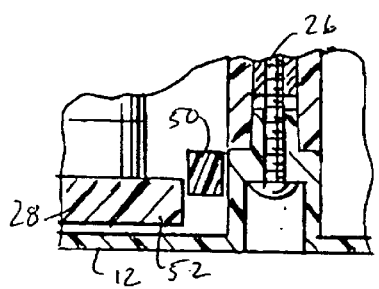
FIG. 6 is a side cross-sectional view taken along line 6—6 of FIG. 4.
Figure 7:
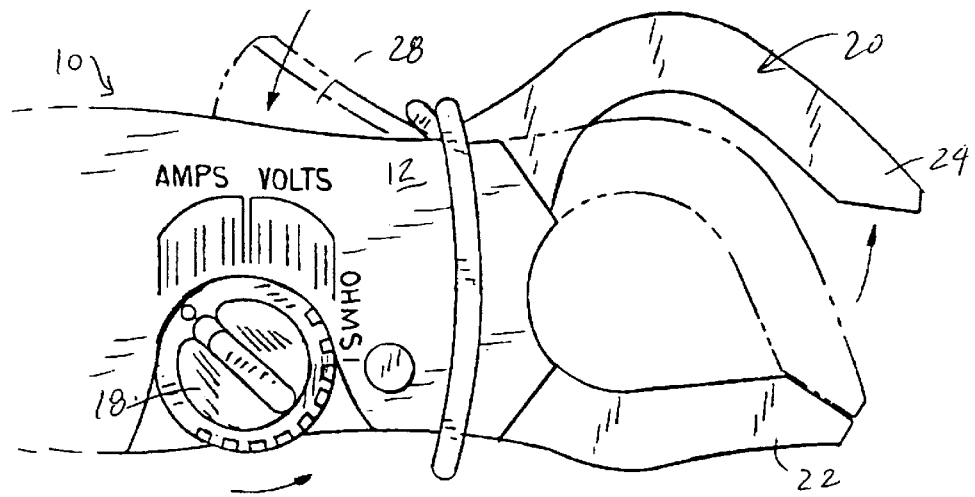
FIG. 7 is partial front plan view similar to FIG. 3 showing a measurement selector positioned to measure current and the current clamp opened.
Figure 8:
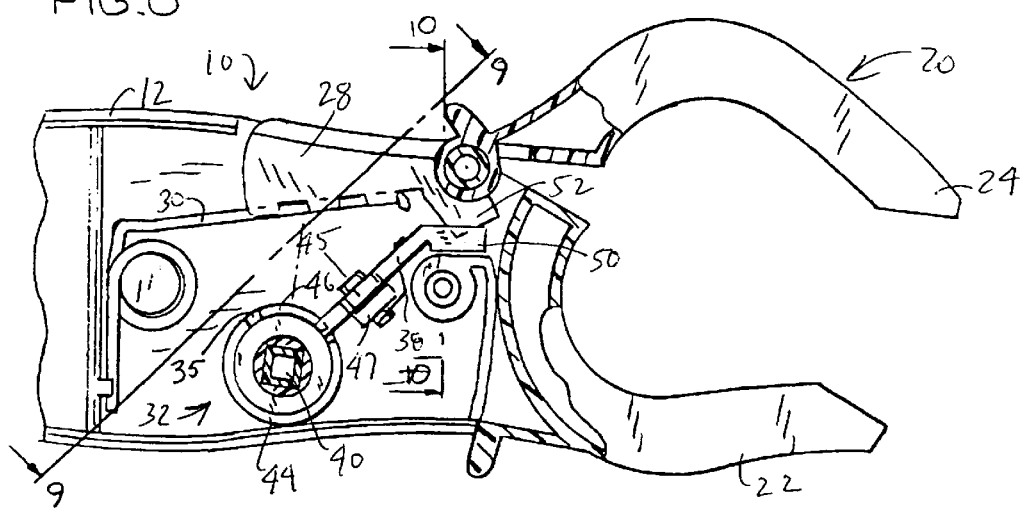
FIG. 8 is a cut-away view of FIG. 7 showing the locking mechanism.
Figure 9:
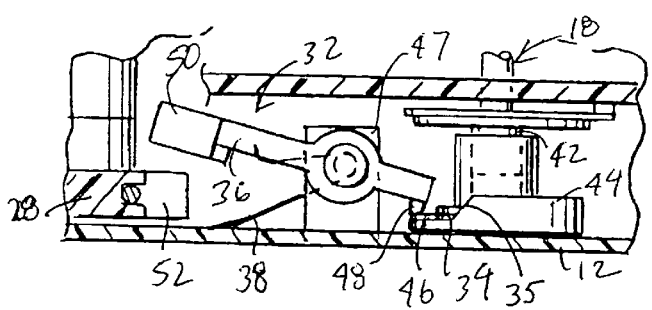
FIG. 9 is a side cross-sectional view taken along line 9—9 of FIG. 8.
Figure 10:
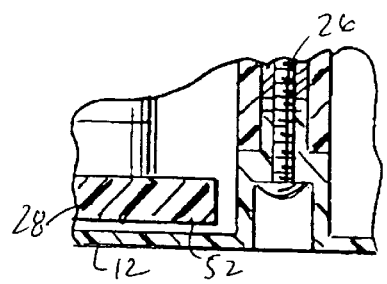
FIG. 10 is a side cross-sectional view taken along line 10—10 of FIG. 8.

Referring to FIGS. 2, 4 and 5, the locking mechanism 32 consists of a cam disk 34, a lever bar 36 and a torsion spring 38. The disk 34 is rotatably mounted inside the housing 12 in registration with the measurement selector 18. The disk 34 has a square recess 40 that receives a square peg 42 extending axially from the measurement selector 18 so that the disk 34 rotates with measurement selector 18. The disk 34 has a raised ridge 44 extending around approximately ⅔ of its circumference ramping down to an arcuate recessed surface 46.

The lever bar 36 is pivotably mounted via a pin 45 connection to a fixed fulcrum member 47 extending inwardly from the inside of the housing 12. The lever bar 36 has a rounded cam follower end 48 and an opposite flat stopper end 50. The lever bar 36 is connected to the torsion spring 38 so that the cam follower end 48 is biased against the circumferential ridge 44 or recess 46 of the disk 34, depending upon the angular position of the disk 34. Thus, as the measurement selector 18 is turned to the desired setting, the disk 34 rotates and the cam follower end 48 of the lever bar 36 rides along the disk 34.

When the measurement selector 18 is positioned so that the multi-meter 10 is set to measure resistance or voltage (as in FIGS. 3–6), the disk 34 is positioned so that the cam follower end 48 contacts the raised ridge 44. In this position, the lever bar 36 is pivoted so that the stopper end 50 lies a stop 52 on the thumb ever 28 and a backstop member 54 integral to the housing 12 so as to be pinched between them when the lever 28 is depressed. This prevents the thumb lever 28 from being depressed and the pivotable jaw 24 from being rotated. In this way, the current clamp 20 is locked so that it cannot be opened in the voltage or resistance measurement modes at the multi-meter 10. The backstop member 54 supports the stopper end 50 of the lever bar 36 and prevents it from bending or breaking in the event a user attempts to depress the thumb lever 28 in the locked position.

Referring to FIGS. 7–10, as the measurement selector 18 is turned to measure current, the cam follower end 48 rides down the ramp 35 to the recessed surface 46. The lever bar 36 is pivoted so that the stopper end 50 does not interfere with the stop 52 of the thumb lever 28. As such, depressing the thumb lever 28 pivots the pivotable jaw 24 to open the current clamp 20. The current clamp 20 can then be fit around an electrical line to measure the current in it.

Illustrative embodiments of the invention have been described in detail for the purpose of disclosing a practical, operative structure whereby the invention may be practiced advantageously. However, the apparatus described above is intended to be illustrative only, and the novel characteristics of the invention may be incorporated in other structural forms without departing from the scope of the invention. For example, other locking mechanisms may be employed to prevent the clamp from opening when not measuring current. Moreover, the clamp may be of a different configuration as long as it provides for a closed path for the loop. Accordingly, to apprise the public of the full scope of the invention, the following claims are made.

What is claimed is:

1. In a multi-meter for detecting current and at least one other electrical characteristic of an electrical circuit, said multi-meter including openable inductive pick-up jaws for detecting current in a current detecting mode of said multi-meter, and a locking mechanism such that said jaws can be opened in said current detecting mode but not in any other mode of said multi-meter.

2. The multi-meter of claim 1, further comprising a measurement selector for switching the sensing circuitry between current detecting and other modes of said multi-meter wherein said selector activates said locking mechanism to prevent said jaws from being opened in modes other than the current detecting mode and permits said jaws to open in said current detecting mode.

* * * * *